(12) United States Patent
Griesser et al.

(10) Patent No.: US 7,484,165 B2
(45) Date of Patent: Jan. 27, 2009

(54) FORWARD ERROR CORRECTION CODING

(75) Inventors: Helmut Griesser, Backnang (DE); Joerg-Peter Elbers, Munich (DE)

(73) Assignee: Ericsson AB, Stockholm (SE)

( * ) Notice: Subject to any disclaimer, the term of this patent is extended or adjusted under 35 U.S.C. 154(b) by 172 days.

(21) Appl. No.: 10/555,209

(22) PCT Filed: Apr. 30, 2004

(86) PCT No.: PCT/EP2004/050673

§ 371 (c)(1), (2), (4) Date: Jul. 27, 2006

(87) PCT Pub. No.: WO2004/098067

PCT Pub. Date: Nov. 11, 2004

(65) Prior Publication Data

US 2007/0067695 A1    Mar. 22, 2007

(30) Foreign Application Priority Data

Apr. 30, 2003 (GB) ................................. 0309877.9

(51) Int. Cl.
*H03M 13/00* (2006.01)
(52) U.S. Cl. ..................................................... 714/782
(58) Field of Classification Search ................ 714/755, 714/782, 784, 786
See application file for complete search history.

(56) References Cited

U.S. PATENT DOCUMENTS 7,146,553 B2 * 12/2006 Jarchi et al. ................. 714/755

OTHER PUBLICATIONS

Arne Dur, On the computation of the performance probabilities for block codes with a bounded-distance decoding rule, Jan. 1988, IEEE Trans. on Info. Theory, vol. 34, No. 1, p. 70-77.*

E. L. Blokh, et al., *Coding of Generalized Concatenated Codes*, Problems of Information Transmission, vol. 10, 1974, pp. 218-222.

V. A. Zinoviev, *Generalised Cascade Codes*, Problems of Information Transmission, vol. 12, No. 1, Mar. 1976, pp. 2-9.

T. Dorsch, et al., *Hierarchical Channel Coding For Broadcastign Employing GC-codes*, Information Theory and Communications Workshop, 1999, Proceedings of the 1999 IEEE Kruger National Park, South Africa, Jun. 20-25, 1999, p. 91.

X. Feng, et al., *Information Set Decodign of Generalised Concatenated Codes*, Communication Technology Proceedings, 1996, ICCT'96, International Conference on Beijing, China, May 5-7, 1996, New York, NY, May 5, 1996, pp. 764-766.

(Continued)

*Primary Examiner*—Shelly A Chase
(74) *Attorney, Agent, or Firm*—Kirschstein, et al.

(57) ABSTRACT

A forward error correcton coding method comprises a generalized concatenated code comprising a plurality of outer component codes and a plurality of inner component codes. The outer components codes comprise Reed-Solomon codes and a plurality of binary codes of equal length but varying rates. The inner component codes have a nested structure and are defined by the sum of disjoint Bose-Chaudhuri-Hocquenghem (BCH) codes. The inner and outer component codes are selected such that the product of the minimum Hamming distances of the inner and outer component codes are as equal as possible. Moreover, the component codes are selected by matching cyclotomic cosets of inner BCH codes and type and multiplicity of outer codes.

10 Claims, 6 Drawing Sheets

OTHER PUBLICATIONS

U. Detmar, et al., *Motified Generalized Concatenated Codes and Their Application To The Construction And Decoding of LUEP Codes*, IEEE Transactions on Information Theory, IEEE Inc., New York, vol. 41, No. 5, Sep. 1, 1995, pp. 1499-1503.

E. Ed Biglieri, et al., European Association for Signal Processign (ERASIP), *Parallel Decodign of Generalized Concatenated Codes*, Signal Processing Theories and Applications, Barcelona, Sep. 18-21, 1990, Proceedings of the European Signal Processing Conference, Amsterdam, vol. 3, p. 1939-1942, Sep. 18, 1990.

U. Wachsmann, et al., *Multilevel Codes: Theoretical Concepts and practical Design Rules*, IEEE Transactions on Information Theory, IEEE, Inc., New York, vol. 45, Jul. 1999, pp. 1361-1391.

Huber Johannes, et al., *Coded Modulation By Multilevel-Codes: Overview and State of The Art*, Internet Article, Online! 1998, URL:http://citeseer.ist.psu.edu/cache/papers/cs/1206/http:zSzzSzwww-nt.e-technik.uni-erlangen.dezSz{dcgzSzpaperszSzitg98_tutorial.pdt/huber98coded.pdf> retrieved on Sep. 3, 2004, p. 3, col. 1, I. 30-col. 2, I. 36.

* cited by examiner

FORWARD ERROR CORRECTION CODING

BACKGROUND OF THE INVENTION

This invention relates to Forward Error Correction (FEC) coding and in particular FEC coding in optical communication systems.

The objective of an optical communication system is to transmit (usually binary) communication data, error free, from a source to a destination in the form of optical radiation (optical channel) modulated with the communications traffic. However, there are many physical effects on the optical channel as it is transmitted from the source to the destination (such as for example random distortions like Amplified Spontaneous Emission ASE or thermal noise and deterministic distortions such as chromatic dispersion, Self Phase Modulation SPM, Cross Phase Modulation XPM, or Four Wave Mixing FWM) that can lead to transmission errors, that is a binary "0" at the input of the channel being received as a binary "1" and vice versa In order to improve the reliability of the channel, a technique known as channel coding is employed. FIG. 1 illustrates a simplified binary channel model of an optical transmission system, comprising at the source, a data source and a channel encoder, the optical channel, and at the destination, a channel decoder and data sink The binary channel includes a laser, modulator, the optical transmission path, and receiver up to a threshold detector.

The principle of channel coding is to add redundancy at the transmitter (usually requiring an increase in transmission speed and thus the bandwidth of the signal) and to use this in-built redundancy at the receiver to correct and/or detect errors. Such coding systems are termed Forward Error Correction (FEC) coding. FEC improves the optical transmission channel to make it more suitable for reliable transmission of communication traffic.

For optical communication systems the redundancy of error correcting coding is usually transmitted out-of-band, that is, transmission of the additional (overhead) symbols increases the transmission rate. Transmission out-of-band ensures a constant information bit rate independent from the error correcting coding rate. However, the rate of the code influences the bandwidth of the signal and therefore increases the requirements for optical and electrical components as well as transmission impairments that depend on the bandwidth. Therefore the redundancy of the channel code should be kept quite low and it is highly desirable to maintain the 7% overhead that is used in current systems. For an optical communication system at a transmission rate of 10 Gbit/s an error correcting code of length 10,000 bits has a transmission delay of just 1ns. The bit error rate (BER) is required to be as low as $10^{-12}$ to $10^{-15}$ and thus long, high rate codes with large minimum distance are required. Moreover, because of the high transmission rate the decoding complexity should be as low as possible. In practice this low bit error rate cannot be verified with standard Monte Carlo simulations and is even difficult to measure. Therefore it is an advantage if the performance of the code can be calculated or estimated sufficiently accurate.

As suggested by several publications [e.g. Y. Katayama, OFC 2003, WN2, pp. 391-393 and O. Ait Sab, OFC 2001, TuF1], the coding gain can easily be improved by adding more redundancy and thus increasing the line rate. However, for enhanced FEC codes it is highly desirable to maintain the 7% overhead, in order to avoid more expensive opto-electronic components and to limit transmission impairments that can arise from a further increase in line rate.

There exist many different types of channel codes, and the problem is to conceive a code that reduces the number of errors as much as possible, and at the same time meets the requirements for the optical communication system As defined in ITU-T G.709 (Approved February 2001) Annex A, the content of which is hereby incorporated by way of reference thereto, the standard out-of-band FEC coding scheme for optical transmission systems has a code rate of 239/255 with an overhead of approx 7% and a net coding gain (NCG) of 6.2 dB at a bit error ratio (BER) of $10^{-15}$.

As represented in FIG. 2 this out-of-band FEC employs a block interleaving of 16 code words of the (255,239,17) Reed-Solomon (RS) code (hereinafter referred to as G.709 RS(255,239) coding). The interleaving is done byte-wise, that is, at the transmitter the first byte of the first code word is sent over the channel, then the first byte of the second code word, and so on. After the first byte of the $16^{th}$ code word has been sent, the second byte of the first code word is transmitted. Decoding is done algebraically up to half the minimum distance. Therefore the code can correct a minimum of 8 arbitrary erroneous bytes and a burst error of $(((8\times16)-1)\times8)+1=1017$ bits. In FIG. 2 the shaded area denote the distribution of redundancy.

In addition to the ITU Recommendation, there exist many proposals for improved error correcting code. Most code constructions are based on the concatenation of two different component codes called an inner and outer code respectively. Code concatenation is a method of building long codes from shorter ones in order to simplify decoding of these codes by a sequential, repetitive or iterative decoder based on decoders for the component codes.

Referring to FIG. 3 there is shown a schematic representation of a communication system including code concatenation. An outer decoder encodes the data in a first encoding step, the encoded data is then scrambled by an interleaver (II) and the scrambled data is then encoded a second time by an inner encoder. At the destination the received data is firstly decoded by an inner decoder in a first decoding step, unscrambled by de-interleaving using a de-interleaver ($II^{-1}$) and then decoded in a second decoding step by an outer decoder. Dependent on the type of component codes and the interleaving scheme used, there exist many variants of concatenated codes. Decoding can be done either sequentially (i.e. first inner decoding then de-interleaving and then outer decoding) decoding each code only once, or with repetitions (also called iteratively).

The first approaches of concatenated codes considered the concatenation of Reed-Solomon (RS) codes. This type of code needs more redundancy (15%-25%) and reach gains of approximately 9 dB-9.5 dB. The increased redundancy, however, is a disadvantage in current systems. This type of concatenation maintains or even increases the large burst error correcting capability of the standard scheme.

A second variant, as first investigated by Forney [D. Forney, Concatenated Codes, MIT Press, Cambridge, 1966], is the concatenation of RS and binary BCH (Bose-Chaudhuri-Hocquenghem) codes resulting in a binary code. In such a coding scheme the RS component code is the outer code and the BGH component code as the inner code. Such a code can achieve a coding gain of up to 8.5 dB with a redundancy of 7% and higher gains for more redundancy.

A third coding variant is the concatenation of two binary BCH codes with a block interleaver resulting in a so-called product code. This approach is well suited for iterative decoding and reaches a high coding gain for bit error rates down to $10^{-10}$-$10^{-12}$. A problem with this type of coding scheme, compared to algebraic codes, is the small minimum Hamming distance that can lead to a behaviour for very low error rates that is similar to an error floor (the output bit error rate decreases very slowly with decreasing input bit error rate). However, the actual behaviour at these low error rates is often difficult to predict A further alternative-coding scheme is to use a very long BCH code that is decoded algebraically achieving a coding gain of approx. 8.4 dB. For this solution there is no error floor problem, but the complexity for decoding is also quite significant. The burst error correcting capability of all these high gain codes is significantly lower compared to the standard.

Generalised (or multilevel) concatenation is a special technique for concatenating codes that leads to better parameters (dimension, minimum Hamming distance) compared to the concatenation according to Forney. The code class (then called generalised error locating codes, and confined to a linear partitioning scheme) was introduced by Blokh and Zyablov [V. Blokh, V. Zyablov, "Coding of generalised concatenated codes,"Problems of Information Transmission, Volume 10 (1974), pp. 218-222] as a generalization of "Error Locating Codes". Later Zinoviev [V. A. Zinoviev, "Generalized cascade codes." Problemy Peredachi Informatssi, vol. 12, no. 1, pp. 5-15, 1976 ] found a more general description based on the partitioning of sets and hence can be used to describe all variants of generalised concatenation.

The use of Reed-Solomon as outer and BCH as inner component codes is widely used for constructing generalised concatenated codes [for example Bosset, "Channel coding for Telecommunications" Wiley 1999]. This is also true for utilising the cyclotomic structure of the BCH codes for describing the partitioning of the inner code. However, the construction of high (but not extremely high) rate codes requires matching all cyclotomic cosets (or unions of them) to non-trivial outer codes. Moreover, the length of the concatenated code calls for a parity check extension of the inner code.

SUMMARY OF THE INVENTION

The present invention has arisen in an endeavour to provide FEC coding for use optical transmission systems that, at least in part, overcomes the limitations of the known coding schemes but without increasing the overhead.

In accordance with the invention a Forward Error Correction coding method comprises a generalised concatenated code comprising a plurality of outer component codes and a plurality of inner component codes characterised by the outer components codes being Reed-Solomon codes and a plurality of binary codes of equal length but varying rates and the inner component codes having a nested structure and are defined by the sum of disjoint Bose-Chaudhuri-Hocquenghem codes.

Advantageously in accordance with the invention the component codes are selected such that the product of the minimum Hamming distances of the inner and outer component codes are as equal as possible. This ensures the concatenated code has a high minimum Hamming distance.

Moreover the component codes are selected by matching cyclotomic cosets of inner BCH codes and type and multiplicity of outer codes. This achieves a very high rate concatenated code.

Changing of the dimension of the binary outer codes and of the Reed-Solomon codes, especially to assimilate neighbouring outer codes, assists in reducing the number of stages for the multistage decoding procedure.

Preferably the code has a length (65280 bits) and rate, which is the same as that of 32 code words of the standard G.709 RS(255,239) code. Such a coding scheme enables it use in existing systems capable of operating with the standard FEC scheme. The coding scheme of the present invention can provide a higher coding gain (CG) without increasing the overhead rate of the code and hence line rate. At the same time the coding scheme avoids flaring effects through a high minimum Hamming distance of the concatenated code and the exploitation of this distance by means of algebraic multistage decoding.

More specifically the outer component codes preferably comprise 31 Reed-Solomon codes. In addition the plurality of binary codes comprises 7 binary (255,247,3) BCH codes and a binary repetition code of length 255.

Preferably the inner component codes use extended BCH codes of length 256.

More specifically the present invention provides a coding scheme whose component codes are defined in Table 1 hereinafter described.

BRIEF DESCRIPTION OF THE DRAWINGS

In order that the present invention can be better understood a coding scheme in accordance with the invention will now be described, by way of example only, with reference to the accompanying drawings in which.

DETAILED DESCRIPTION OF THE PREFERRED EMBODYMENTS

As discussed concatenated codes were first proposed by Forney [D. Forney, Concatenated Codes, MIT Press, Cambridge, 1966]. Code concatenation allows long codes to be built from comparatively shorter component codes, and allows efficient decoding via the component codes. A generalised version of code concatenation (hereinafter termed GC codes) was introduced by Blokh and Zyablov [V. Blokh, V. Zyablov, "Coding of generalised concatenated codes," Problems of Information Transmission, Volume 10 (1974), pp. 218-222]. In the following description of the coding scheme of the invention generalised concatenation is described as a sum of concatenated codes.

The addition of two code words of equal length, and over the same field, is done by adding the code vectors symbol by symbol The addition of two codes $B_1$ and $B_2$ is given as the addition of all possible pairs of code words with one code word from each code $B_1 \oplus B_2 = \{b_1 \oplus b_2 | b_1 \epsilon B_1, b_2 \epsilon B_2\}$. If two linear codes have no common code word (except the all zero code word) then they are called "disjoint" and the dimension of the sum of the codes is given as the sum of the dimension of the addends. Let $\{B_i | i=1, \ldots, L\}$ be a set of disjoint linear codes over the Galois field GF(q). A nested structure of sub codes is achieved by defining the sum of codes:

$$B'_i = B_1 \oplus \ldots \oplus B_i = \sum_{j=1}^{i} B_j, i = 1, \ldots, L.$$

Figure 1:
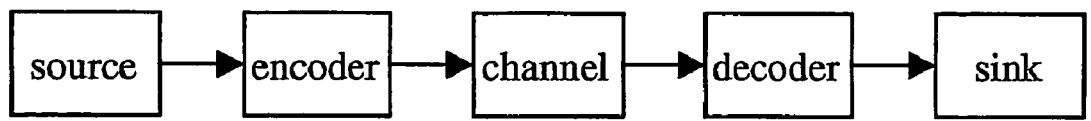
FIG. 1 is a representation of a binary channel model for an optical communication system.
Figure 2:
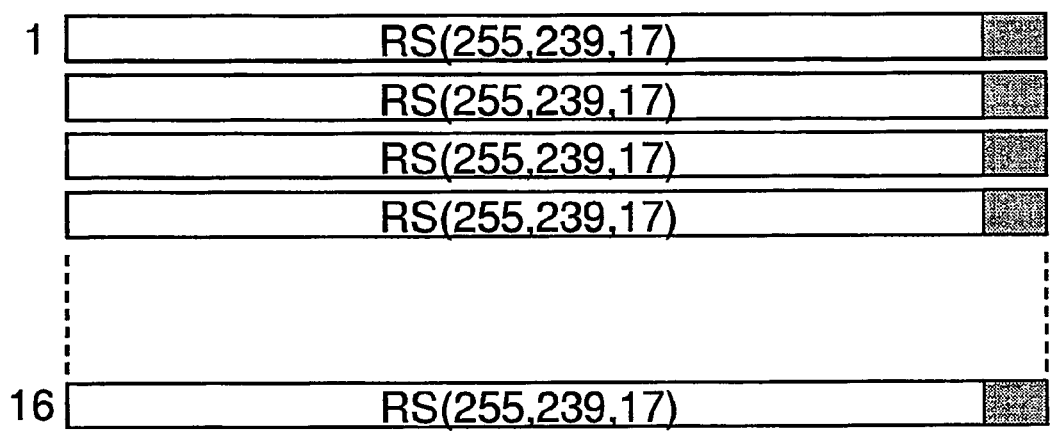
FIG. 2, as previously described, is a diagrammatic representation of a frame for ITU Recommendation G.709 Reed-Solomon (239,255) FEC.
Figure 3:
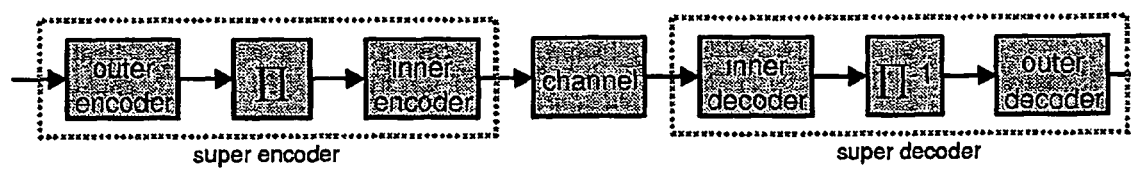
FIG. 3 is a diagrammatic representation of a coding scheme in accordance with the invention.
Figure 4:
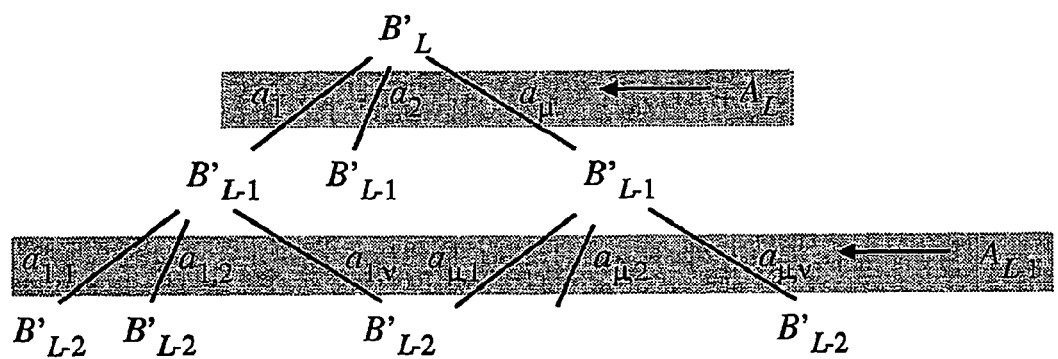
FIG. 4 are plots of bit error ratio (BER) versus signal to noise ratio (SNR) per bit (dB) for various coding schemes.

This structure can be ill by a so-called partition tree as represented in FIG. 4, which depicts the partition tree of the inner component code. The outer codes $A_i$ "protect" the labelling of the partition.

The concatenation of two codes according to Forney is $C_i(Nn,K_i,k_i,D_id_i)=A_i \oplus B_i$, with $A_i(N,K_i,D_i)$ a code over the extension field $GF(q^m)$ and $B_i(n,k_i,d_i)$ a code with dimension m over GF(q). During concatenation each symbol of the outer code is replaced by a unique code word of the inner code. The sum of concatenated codes:

$$C = \sum_{l=1}^{L} A_i \otimes B_i$$

is a generalised concatenated code of length Nn, and dimension $\Sigma_{i=1}^{L} K_i k_i$. The minimum hamming distance of C can be bounded by $d_{min} \geq \min_i \{D_i d_i'\}$, where $D_i$ and $d_i'$ are the minimum Hamming distance of the $i^{th}$ outer and inner codes $A_i$ and $B_i'$ [see V. A Zinoviev, "Generalized cascade codes." Problemy Peredachi Informatsii, vol. 12, no. 1, pp. 5-15, 1976 the content of which is hereby incorporated by way of reference thereto].

In accordance with invention the component codes $A_i$ and $B_i'$ are selected such that the product of the minimum Hamming distances of the inner and outer component codes, $D_i d_i'$, are as equal as possible (balanced distance rule) to ensure the concatenated code has a high minimum Hamming distance.

A BCH (Bose-Chaudhuri-Hocquenghem) code can be defined via the roots of its parity check polynomial and these roots are grouped into cyclotomic cosets. Codes from different cyclotomic cosets are disjoint codes. In accordance with the coding of the invention extended BCH codes of length 256 are used for the nested inner codes. As outer codes, 31 Reed-Solomon (RS) codes over $GF(2^8)$ are used. In addition a binary repetition code of length 255 and 7 binary (255,247,3) BCH codes are employed.

Table 1 gives an overview of all codes used in the generalised (multilevel) concatenated coding scheme of the invention. The outer component codes $A_i$ for i=1 to 5 and 7 to 32 are Reed-Solomon codes, RS(N,K,D), and are symbol based (m=8). The outer components codes $A_i$ for i=6 are 7 parallel binary (bit based) BCH codes and for i=33 is a binary repetition code. The inner component codes $B_i'$ are defined by the sum of the disjoint of BCH codes.

The concatenated code has a length of 65280 bits, a dimension of 61210 bits and a its minimum distance is greater or equal to 252. For a replacement of the G.709 standard FEC scheme only 61184 bits are used to carry the transmitted information, the additional 26 bits may used for proprietary information.

Figure 5:
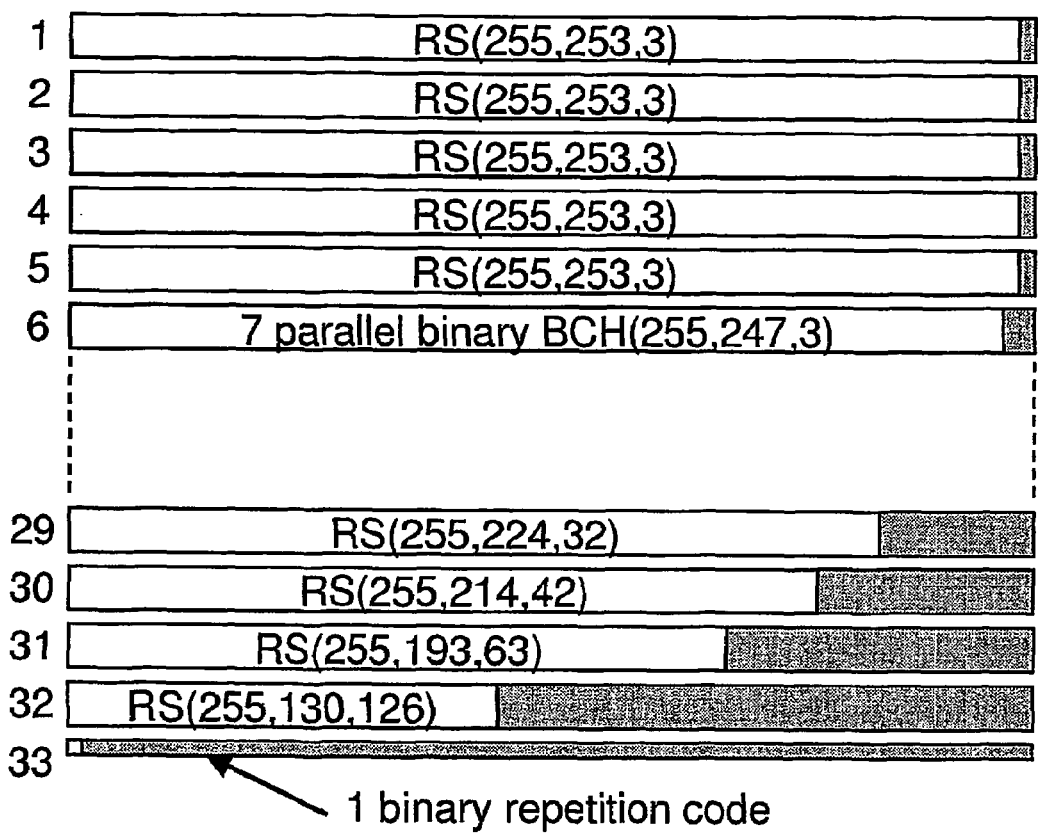
FIG. 5 is a diagrammatic representation of the distribution of the redundancy of the outer codes of the generalized concatenated code construction.

The second column in Table 1 contains the cyclotomic cosets that were used to construct the corresponding inner code addend. The code construction can be interpreted as block interleaving of codes with varying rates and a final re-mapping of all columns defined by an inner code of rate 1. FIG. 5 illustrates the distribution of the redundancy of the outer codes of the generalised concatenated code construction. This Figure shows the variable distribution of the redundancy (shaded in grey) for the outer codes of the concatenated coding scheme of the invention. In a second encoding step the binary interpretation of the symbols is mapped column by column into the final code word.

Figure 6:
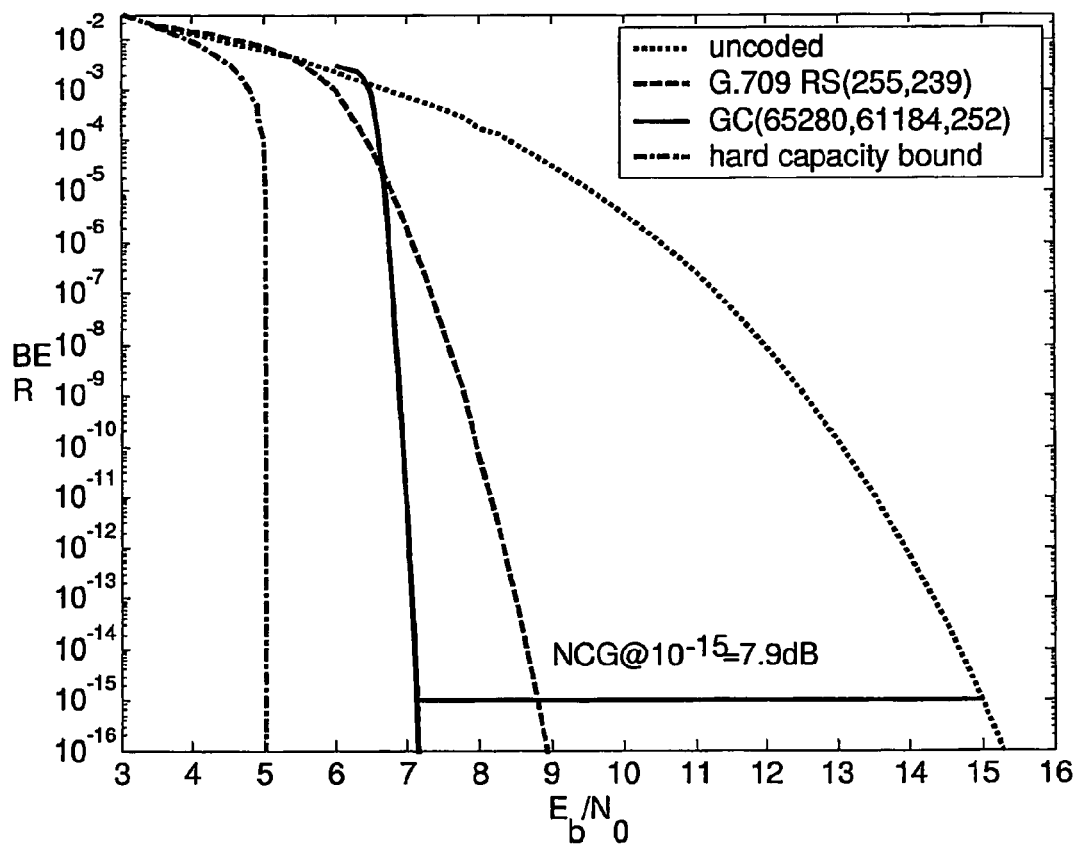
FIG. 6 is a plot of the coding scheme of the invention in solid lines as compared to an uncoded system in dotted lines.

An estimation of the performance of the concatenated code of the invention was made assuming algebraic multistage decoding up to half the minimum distance [V. A. Zinoviev, V. V. Zyablov, "Decoding of nonlinear generalized cascade codes." Problemy Peredachi Infomatsii, vol.14, no. 2, pp. 46-52, 1978]. Referring to FIG. 6 there are shown plots of Bit Error Ratio (BER) versus input signal-to-noise ratio (SNR) per bit ($E_b/N_0$) for the coding scheme of the invention GC(65280,61184,252), for ITU-T G.709 RS(255,239) and uncoded schemes. As will be apparent from FIG. 6, for a reference BER of $10^{-15}$, the coding scheme of the invention (denoted by the solid line and referenced GC(65280,61184, 252) in FIG. 6) provides a net coding gain (NCG) of 7.9 dB over an uncoded system (doted line) in which the coding gain is defined as the difference in input SNR for a given output BER. Furthermore the coding scheme of the invention provides a coding gain of 1.7 dB over the G.709 standard coding scheme (denoted G.709 RS(255,239) in FIG. 6 and illustrated by a dashed line) whilst retaining the same line rate. Moreover the code of the present invention is only approximately 2 dB worse than the Shannon limit for hard decision decoding (denoted hard capacity bound in FIG. 6 and represented by a dash/dot line).

Table 2 compares the coding scheme of the present invention with other different coding schemes: these being the coding scheme of G.709 RS(255,239) and two concatenated codes of Katayama [Y. Katayama, OFC 2003, WN2, pp. 391-3934].

TABLE 2

| Concatenated code | length | overhead | $d_{min}$ | NCG |
|---|---|---|---|---|
| G.709 (16 × RS(255,239)) | 32640 | 6.69% | 17 | 6.2 dB |
| Coding Scheme of the invention | 65280 | 6.69% | 252 | 7.9 dB |
| BCH(256,239) ⊗ RS(255,239) | 65280 | 14.28% | 102 | 8.8 dB |
| BCH(256,223) ⊗ RS(255,239) | 65280 | 22.48% | 170 | 9.2 dB |

Table 2 shows that the coding scheme of the invention has a high minimum distance $d_{min}$, which avoids error floor like effects (referred to as "flaring" effects) for low bit error rates. In contrast the codes of Katayama, which are decoded iteratively, achieve higher gains at a BER of $10^{-15}$, but this is at the expense of a significantly increased overhead.

It should be noted that although an extremely long BCH code of length 65280 could be constructed giving rise to an additional coding gain of approximately 0.8 dB compared to coding scheme of the invention, algebraic decoding of such a code requires to operate with the very large field $GF(2^{16})$. In contrast the coding scheme of the invention only needs to operate with the field $GF(2^8)$, which is considerably less complex. Decoding of the code of the invention can be done very efficiently by using algebraic decoders for the component codes and it allows an exact estimation of the performance at BER's as low as $10^{-15}$ without any simulations. The generalised concatenated code of the invention is based on outer Reed-Solomon codes of equal length, but varying rates. The inner decoding stage is a BCH code with a nested structure. The code preferably has the same length and rate of 32 code words of the G.709 RS(255,239) code and can thus be used to seamlessly replace the standard scheme.

It will be appreciated by those skilled in the art that variations can be made to the coding scheme of the invention without departing from the scope of the invention.

TABLE 1

Component codes of the generalised concatenated code

| i | cycl. cosets of $B_i$ | inner code $B_i'$ | | | outer code $A_i$ | | | |
|---|---|---|---|---|---|---|---|---|
| | | n' | k' | d' | N | K | D | m |
| 1 | 127 | 256 | 8 | 121 | 255 | 253 | 3 | 8 |
| 2 | 111 | 256 | 16 | 113 | 255 | 253 | 3 | 8 |
| 3 | 95 | 256 | 24 | 97 | 255 | 253 | 3 | 8 |
| 4 | 91 | 256 | 32 | 93 | 255 | 253 | 3 | 8 |
| 5 | 87 | 256 | 40 | 89 | 255 | 253 | 3 | 8 |
| 6 | 0, 58, 119 | 256 | 47 | 86 | 255 | 247 | 3 | 7 |
| 7 | 63 | 256 | 55 | 64 | 255 | 252 | 4 | 8 |
| 8 | 61 | 256 | 63 | 62 | 255 | 251 | 5 | 8 |
| 9 | 59 | 256 | 71 | 60 | 255 | 251 | 5 | 8 |
| 10 | 55 | 256 | 79 | 56 | 255 | 251 | 5 | 8 |
| 11 | 53 | 256 | 87 | 54 | 255 | 251 | 5 | 8 |
| 12 | 47 | 256 | 95 | 48 | 255 | 250 | 6 | 8 |
| 13 | 45 | 256 | 103 | 46 | 255 | 250 | 6 | 8 |
| 14 | 43 | 256 | 111 | 44 | 255 | 250 | 6 | 8 |
| 15 | 39 | 256 | 119 | 40 | 255 | 249 | 7 | 8 |
| 16 | 37 | 256 | 127 | 38 | 255 | 249 | 7 | 8 |
| 17 | 31 | 256 | 135 | 32 | 255 | 248 | 8 | 8 |
| 18 | 29 | 256 | 143 | 30 | 255 | 247 | 9 | 8 |
| 19 | 27 | 256 | 151 | 28 | 255 | 247 | 9 | 8 |
| 20 | 25 | 256 | 159 | 26 | 255 | 246 | 10 | 8 |
| 21 | 23 | 256 | 167 | 24 | 255 | 245 | 11 | 8 |
| 22 | 21 | 256 | 175 | 22 | 255 | 244 | 12 | 8 |
| 23 | 19 | 256 | 183 | 20 | 255 | 243 | 13 | 8 |
| 24 | 17, 51 | 256 | 191 | 18 | 255 | 242 | 14 | 8 |
| 25 | 15 | 256 | 199 | 16 | 255 | 240 | 16 | 8 |
| 26 | 13 | 256 | 207 | 14 | 255 | 238 | 18 | 8 |
| 27 | 11 | 256 | 215 | 12 | 255 | 235 | 21 | 8 |
| 28 | 9 | 256 | 223 | 10 | 255 | 230 | 26 | 8 |
| 29 | 7 | 256 | 231 | 8 | 255 | 224 | 32 | 8 |
| 30 | 5 | 256 | 239 | 6 | 255 | 214 | 42 | 8 |
| 31 | 3 | 256 | 247 | 4 | 255 | 193 | 63 | 8 |
| 32 | 1 | 256 | 255 | 2 | 255 | 130 | 126 | 8 |
| 33 | | 256 | 256 | 1 | 255 | 1 | 255 | 1 |

The invention claimed is:

1. A method of encoding communications data with forward error correction coding in an optical communications system, the method comprising: forming a generalized concatenated code with a plurality of outer component codes and a plurality of inner component codes, in which the outer component codes are formed as Reed-Solomon (RS) codes and a plurality of binary codes of equal length, but varying rates; and the inner component codes are formed with a nested structure defined by a sum of disjoint Bose-Chaudhuri-Hocquenghem (BCH) codes.

2. The method according to claim 1, comprising selecting the outer and inner component codes such that a product of minimum Hamming distances of the inner and outer component codes are substantially equal.

3. The method according to claim 1, comprising selecting the outer and inner component codes by matching cyclotomic cosets of inner BCH codes and type and multiplicity of outer component codes.

4. The method according to claim 1, comprising constituting the outer component codes as 31 RS codes.

5. The method according to claim 1, comprising constituting the plurality of binary codes as 7 binary BCH codes and a binary repetition code of length 255.

6. The method according to claim 1, comprising constituting the inner component codes as extended BCH codes of length 256.

7. The method according to claim 1, in which the length of the concatenated code is 65280 bits.

8. An encoder for encoding communications data with forward error correction coding in an optical communications system, the encoder configured to form a generalized concatenated code comprising a plurality of outer component codes and a plurality of inner component codes, in which the outer component codes are formed as Reed-Solomon (RS) codes and a plurality of binary codes of equal length, but varying rates; and the inner component codes are formed with a nested structure defined by a sum of disjoint Bose-Chaudhuri-Hocquenghem (BCH) codes.

9. A method of decoding an optical signal which comprises forward error correction coding, the method comprising: decoding a generalized concatenated code comprising a plurality of outer component codes and a plurality of inner component codes, in which the outer component codes are formed as Reed-Solomon (RS) codes and a plurality of binary codes of equal length, but varying rates; and the inner component codes are formed with a nested structure defined by a sum of disjoint Bose-Chaudhuri-Hocquenghem (BCH) codes.

10. A decoder for decoding forward error correction coding of an optical signal, the decoder configured to decode a generalized concatenated code comprising a plurality of outer component codes and a plurality of inner component codes, in which the outer component codes are formed as Reed-Solomon (RS) codes and a plurality of binary codes of equal length, but varying rates; and the inner component codes are formed with a nested structure defined by a sum of disjoint Bose-Chaudhuri-Hocquenghem (BCH) codes.

* * * * *